United States Patent
Chuang (10) Patent No.: US 8,026,124 B2
(45) Date of Patent: Sep. 27, 2011

(54) METHOD FOR FABRICATING COPPER/INDIUM/GALLIUM/SELENIUM SOLAR CELL BY WET PROCESS UNDER NON-VACUUM CONDITION

(75) Inventor: Chuan-Lung Chuang, Taoyuan (TW)

(73) Assignee: Jenn Feng New Energy Co., Ltd., Taoyuan (TW)

( * ) Notice: Subject to any disclaimer, the term of this patent is extended or adjusted under 35 U.S.C. 154(b) by 20 days.

(21) Appl. No.: 12/696,324

(22) Filed: Jan. 29, 2010

(65) Prior Publication Data

US 2011/0189813 A1   Aug. 4, 2011

(51) Int. Cl.
*H01L 21/00* (2006.01)

(52) U.S. Cl. ....... 438/95; 438/48; 438/57; 257/E31.007; 257/E31.015; 257/E31.027

(58) Field of Classification Search ............ 438/48, 438/57, 84, 86, 95; 257/E31.007, E31.015, 257/E31.027
See application file for complete search history.

(56) References Cited

U.S. PATENT DOCUMENTS

| | | | | |
|---|---|---|---|---|
| 5,985,691 | A * | 11/1999 | Basol et al. | 438/95 |
| 6,127,202 | A * | 10/2000 | Kapur et al. | 438/47 |
| 7,224,036 | B2 * | 5/2007 | Kojima et al. | 257/431 |
| 7,560,641 | B2 * | 7/2009 | Menezes | 136/264 |
| 2006/0145145 | A1 * | 7/2006 | Nishio | 257/40 |
| 2006/0207644 | A1 * | 9/2006 | Robinson et al. | 136/243 |
| 2007/0163640 | A1 * | 7/2007 | Van Duren et al. | 136/262 |
| 2008/0124831 | A1 * | 5/2008 | Robinson et al. | 438/84 |
| 2008/0135099 | A1 * | 6/2008 | Yu et al. | 136/264 |
| 2010/0218827 | A1 * | 9/2010 | Aono et al. | 136/264 |

* cited by examiner

*Primary Examiner* — Walter L Lindsay, Jr.
*Assistant Examiner* — Leonard Chang
(74) *Attorney, Agent, or Firm* — Rabin & Berdo, P.C.

(57) ABSTRACT

A method for fabricating a copper/indium/gallium/selenium solar cell by a wet process under non-vacuum condition is provided. In the method for fabricating a copper/indium/gallium/selenium solar cell by a wet process under non-vacuum condition, a substrate having a backside electrode layer is provided, and then a first transparent conduction oxide (TCO) layer, a copper/indium/gallium/selenium layer and a cadmium sulfide layer, a zinc oxide layer, and a second TCO layer are sequentially formed on the backside electrode layer by using a first TCO layer forming process, a copper/indium/gallium/selenium layer and a cadmium sulfide layer forming process, a zinc oxide layer forming process, and a second TCO layer forming process to form the copper/indium/gallium/selenium solar cell with a high conversion efficiency, wherein the first TCO layer forming process, the zinc oxide layer forming process, and the second TCO layer forming process respectively comprise a laser cutting process to individually perform laser cutting and scraping knife cutting for the work piece such that the segmented work pieces are formed for increasing the integration of process and the quality of production.

16 Claims, 7 Drawing Sheets

METHOD FOR FABRICATING COPPER/INDIUM/GALLIUM/SELENIUM SOLAR CELL BY WET PROCESS UNDER NON-VACUUM CONDITION

BACKGROUND OF THE INVENTION

1. Field of the Invention

The present invention relates to a method for fabricating a copper/indium/gallium/selenium solar cell, and more specifically to a method for fabricating a copper/indium/gallium/selenium solar cell by a wet process under non-vacuum condition.

2. The Prior Arts

Since a copper/indium/gallium/selenium (CIGS) solar cell has high conversion efficiency, for example, the conversion efficiency of unit cell is up to 20%, and the conversion efficiency of solar cell module is also up to 14%, such that CIGS solar cells receive significant attention from the solar cell industry, and more particularly, CIGS solar cell is not restricted by the upstream raw materials.

Conventionally, the processes for fabricating CIGS solar cell generally can be divided into vacuum processes and non-vacuum processes. In vacuum processes, evaporation method and sputtering method are mainly used, and however, the expensive process equipments are requested and the efficiency of material utilization is low in vacuum processes, such that the whole fabricating cost is high. In the non-vacuum processes, the printing method and the electrodepositing method are generally used. However, the mass production of large-area solar cell is not matured, and is still stayed in the laboratory stage, so that there is no commercial large-area solar cell product in the market.

Therefore, a highly integrated non-vacuum process method is needed, and more particularly, a process in which a first transparent conducting oxide layer, a copper/indium/gallium/selenium layer, a cadmium sulfide layer, a zinc oxide layer, and a second transparent conducting oxide layer are sequentially formed on a backside electrode layer to form a CIGS solar cell with high conversion efficiency, high quality, and high reliability, and the fabricating cost is low.

SUMMARY OF THE INVENTION

A primary objective of the present invention is to provide a method for fabricating a copper/indium/gallium/selenium solar cell by a wet process under non-vacuum condition. The process for fabricating a copper/indium/gallium/selenium solar cell, in which a first transparent conducting oxide (TCO) layer, a copper/indium/gallium/selenium layer, a cadmium sulfide layer, a zinc oxide layer, and a second transparent conducting oxide (TCO) layer are sequentially formed on a backside electrode layer to form a copper/indium/gallium/selenium (CIGS) solar cell with a high conversion efficiency, wherein the backside electrode layer is formed on a substrate, and the method for fabricating a copper/indium/gallium/selenium solar cell by a wet process under non-vacuum condition comprises sequentially conducting a first TCO layer forming process, a copper/indium/gallium/selenium layer forming process, a cadmium sulfide layer forming process, a zinc oxide layer forming process, and a second TCO layer forming process. The first TCO layer forming process, the zinc oxide layer forming process, and the second TCO layer forming process respectively comprise a cutting process which performs a laser cutting process and a scraping knife cutting process sequentially for a work piece to form the segmented work pieces for increasing process integration and the whole photoelectric quality of copper/indium/gallium/selenium (CIGS) solar cell.

The first TCO layer forming process comprises a mixing process, a coating layer forming process, a drying process, a compacting process, a thermal process, and a cutting process to form the first TCO layer having uniform thickness and better crystal structure on the backside electrode layer.

The copper/indium/gallium/selenium layer and the cadmium sulfide layer forming process comprises sequentially forming the copper/indium/gallium/selenium layer and forming the cadmium sulfide layer on a first slurry coating layer formed in the first TCO layer forming process, wherein the copper/indium/gallium/selenium layer as the absorption layer is formed by a mixing process, a coating layer forming process, a drying process, a compacting process, a primary selenization/sulfidation reaction process, a thermal process, an impure phase removing process and a rear stage selenization/sulfidation reaction process. The cadmium sulfide layer, as a buffer layer, is formed by a chemical bath deposition (CBD) method.

The zinc oxide layer forming process comprises a mixing process, a coating layer forming process, a drying process, a compacting process, a thermal process, and a cutting process to form the zinc oxide layer on the cadmium sulfide layer.

The second TCO layer forming process, which is similar to the first TCO layer forming process, comprises a mixing process, a coating layer forming process, a drying process, a compacting process, a thermal process, and a cutting process to form the second TCO layer on the zinc oxide layer.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
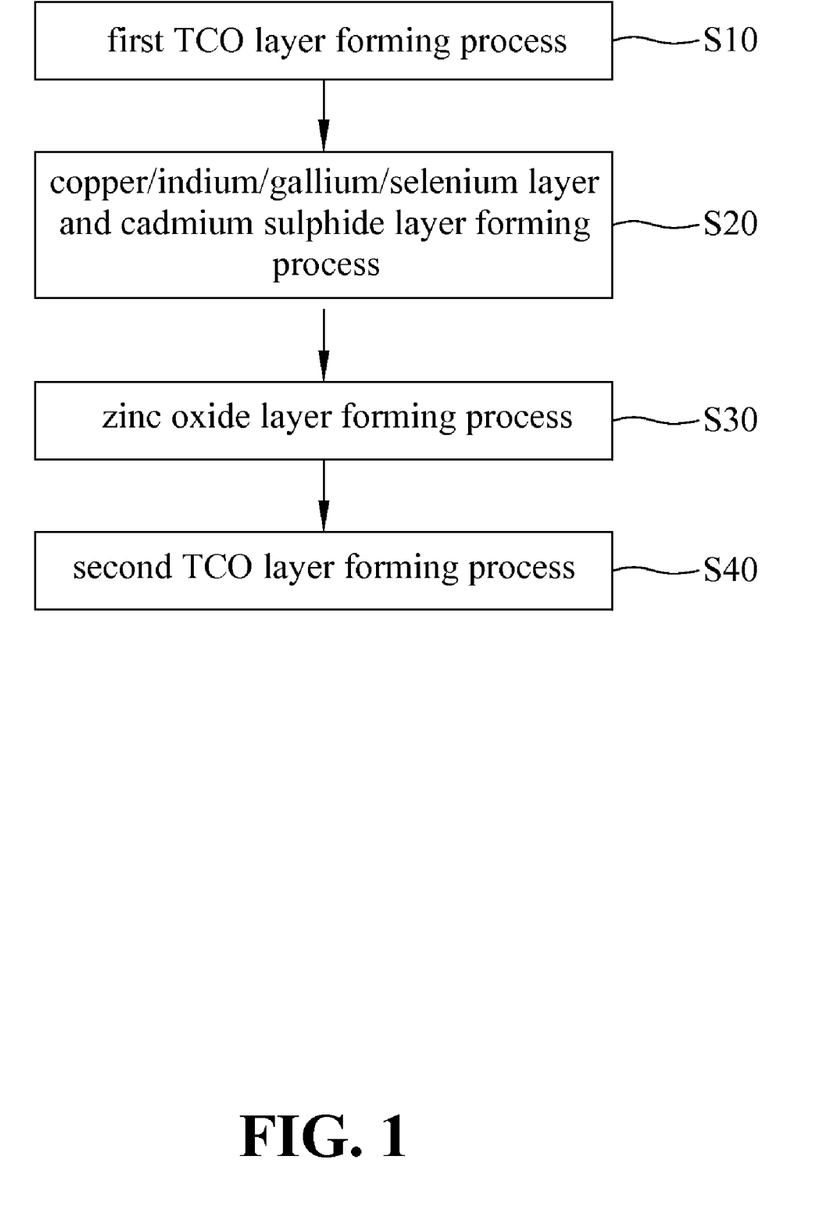
FIG. 1 is a block diagram illustrating the method for fabricating a copper/indium/gallium/selenium solar cell by a wet process under non-vacuum condition according to the present invention.

Referring to FIG. 1, a block diagram illustrating the method for fabricating a copper/indium/gallium/selenium solar cell by a wet process under non-vacuum condition according to the present invention. As shown in FIG. 1, the method for fabricating a copper/indium/gallium/selenium solar cell by a wet process under non-vacuum condition according to the present invention starts at step S10 that performs a first TCO layer forming process to form a first TCO layer on a backside electrode layer located on a substrate by using a first TCO layer forming apparatus by the wet process under non-vacuum condition, and to move the substrate forward. In the next step S20, a copper/indium/gallium/selenium layer and a cadmium sulfide layer forming process is performed by using a copper/indium/gallium/selenium layer and a cadmium sulfide layer forming apparatus to sequentially form a copper/indium/gallium/selenium layer and a cadmium sulfide layer from bottom to top on the first TCO layer. In step S30, a zinc oxide layer forming process is performed by using a zinc oxide layer forming apparatus to form a zinc oxide layer on the cadmium sulfide layer. Finally in step S40, a second TCO layer forming process is performed by using a second TCO layer forming apparatus to form a second TCO layer on the zinc oxide layer. Therefore, the substrate, the backside electrode layer, the first TCO layer, the copper/indium/gallium/selenium layer, the cadmium sulfide layer, the zinc oxide layer, the second TCO layer are laminated from bottom to top to form a copper/indium/gallium/selenium solar cell.

Figure 2:
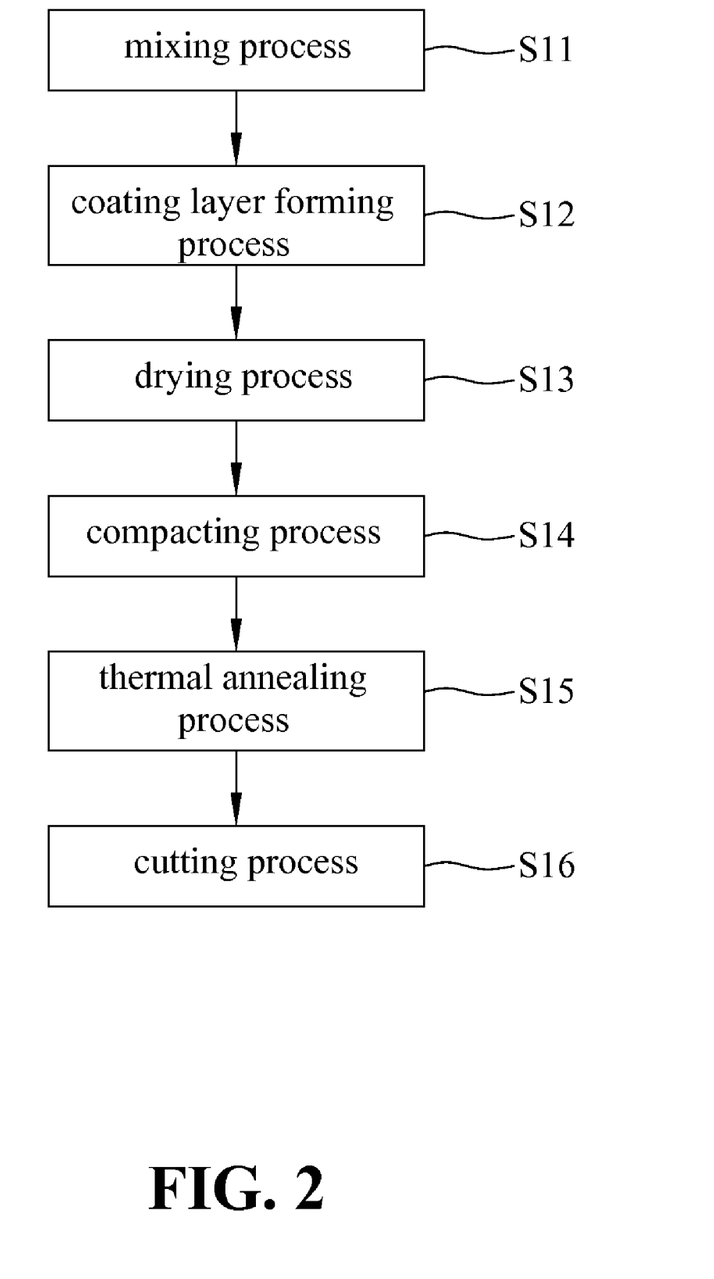
FIG. 2 is a block diagram illustrating an apparatus for forming the first TCO layer according to the present invention.

Referring to FIG. 2, a block diagram illustrating an apparatus for forming the first TCO layer according to the present invention. As shown in FIG. 2, the first TCO forming step of S10 starts at step S11 that performs a mixing process by using a mixing apparatus to uniformly mix at least one powder and at least one solvent into the first TCO slurry, wherein the at least one powder can comprise at least one of indium tin oxide (ITO), tin dioxide ($SnO_2$), indium titanium oxide (ITiO) and aluminum zinc oxide (AZO), and the at least one solvent can comprise at least one of alcohols, amines, dispersant, adhesive and levelling agents.

Then upon entering step S12, a coating layer forming process is performed by using a coating layer forming apparatus such that the first TCO slurry produced at the step S11 is formed on the backside electrode layer to form a first TCO slurry coating layer. Then, a drying process is performed by using a drying apparatus at step S13 to pre-dry and remove the solvent in the first TCO slurry coating layer.

Then upon entering step S14, a compacting process is performed by using a compacting apparatus for the dried first TCO slurry coating layer. By using the compacting apparatus, the pressure is applied to the first TCO slurry coating layer such that the first TCO slurry coating layer becomes compacted. In step S15, a thermal process, such as a rapid thermal annealing process (RTP), is performed by using a thermal process apparatus for the first TCO slurry coating layer to improve the crystal structure of the first TCO slurry coating layer and to form a first TCO layer. Finally upon entering step S16, a cutting process is performed by using a cutting apparatus to form the segmented work pieces including the substrate, the backside electrode layer, and the first TCO layer.

Figure 3:
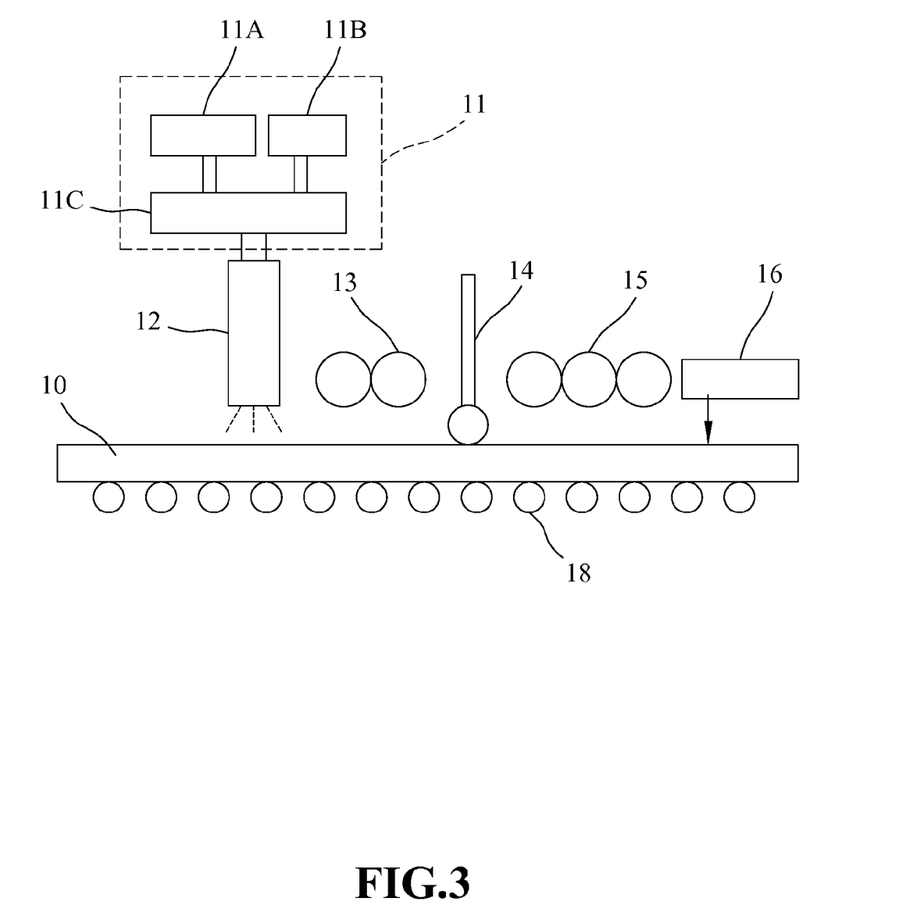
FIG. 3 is a schematic diagram illustrating the first TCO layer forming apparatus according to the present invention.

Referring to FIG. 3, a schematic diagram illustrates the first TCO layer forming apparatus according to the present invention. As shown in FIG. 3, the first TCO layer forming apparatus comprises a mixing apparatus 11, a coating layer forming apparatus 12, a drying apparatus 13, a compacting apparatus 14, a thermal process apparatus 15, and a cutting apparatus 16, and by using the above-mentioned apparatuses, the mixing process, the coating layer forming process, the drying process, the compacting process, the thermal process, and the cutting process in FIG. 2 are performed respectively to form the first TCO layer on the backside electrode layer which locates on the substrate 10. The substrate 10 is supported by a plurality of rollers thereunder and drove forward.

The mixing apparatus 11 comprises a powder trough 11A, a solvent trough 11B, and a mixing trough 11C, wherein the powder trough 11A contains at least one powder, and the solvent trough 11B contains at least one solvent. The mixing trough 11C can be an ink mixing trough for uniformly mixing at least one powder from the powder trough 11A and at least one solvent from the solvent trough 11B to form the first TCO slurry.

The coating layer forming apparatus 12 can comprise one of a spray coating apparatus for performing spray-coating, a coating apparatus for performing coating, and an immersing apparatus for immersing. The spray coating apparatus is used in the present invention as an example for showing the characteristics of the present invention. In FIG. 3, the spray coating apparatus can comprise a plurality of supersonic nozzles, a supersonic controller, and an air pressure flow rate controller (not shown). The first TCO slurry is spray-coated uniformly on the backside electrode by using the supersonic to form the first slurry coating layer. The drying apparatus 13 is a heating apparatus which comprises at least one of an electrically heated wire, a ultra-red (IR) ray source, and a radiation source which comprises a microwave source.

The compacting apparatus 14 can comprise one of a rolling apparatus for performing a rolling process, a high-pressure liquid laminate spray apparatus for performing a high-pressure liquid laminate spray process, and a high-pressure gas laminate spray apparatus for performing a high-pressure gas laminate spray process. The rolling apparatus is used in the present invention as an example for showing the characteristics of the present invention. The rolling apparatus 14 comprises a plurality of rollers to press on the first slurry coating layer and sequentially applies low pressure, middle pressure and high pressure to a low pressure section, a middle pressure section, and a high pressure section respectively such that the first TCO slurry coating layer becomes compacted step by step.

The thermal process apparatus 15 comprises a heating apparatus and a cooling apparatus to sequentially perform a rapid thermal crystallization process, a multi-stage crystallization process at a constant temperature, and a multi-stage cooling process for the first TCO slurry coating layer to improve the crystal structure and to form the first TCO layer. The cutting apparatus 16 comprises a laser and a scraping knife to perform the cutting process.

Figure 4:
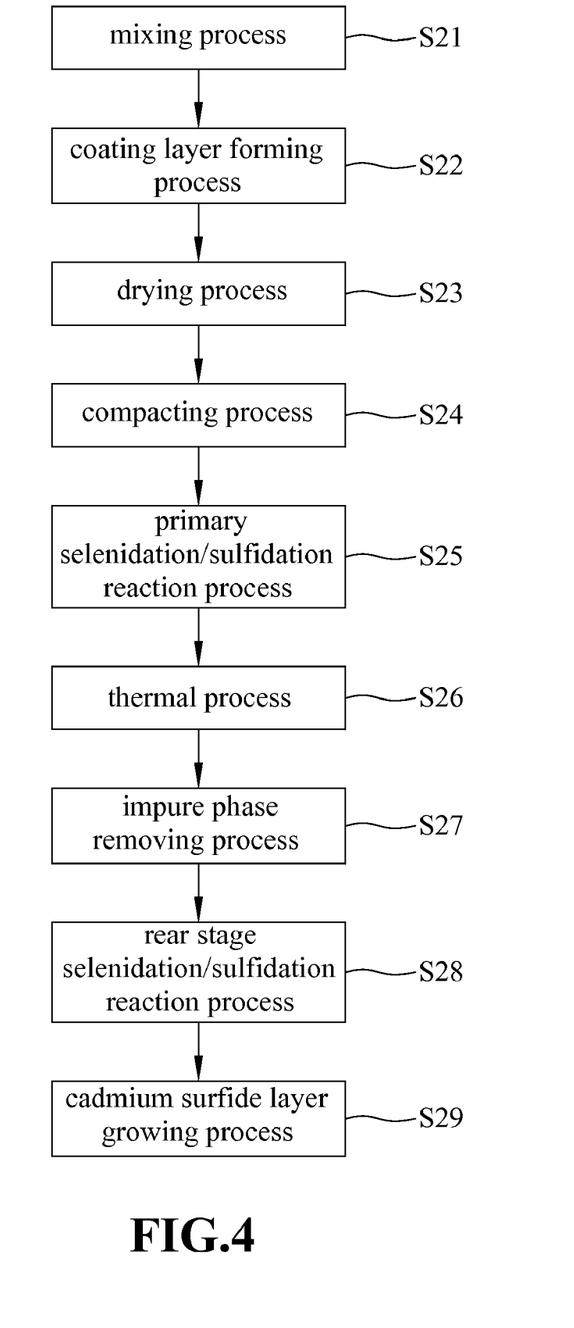
FIG. 4 is a block diagram illustrating the copper/indium/gallium/selenium layer and the cadmium sulfide layer forming process according to the present invention.

Referring to FIG. 4, a block diagram illustrates the copper/indium/gallium/selenium layer and the cadmium sulfide layer forming process according to the present invention. As shown in FIG. 4, the copper/indium/gallium/selenium layer and the cadmium sulfide layer forming process of step S20 sequentially comprises a mixing process of step S21, a coating layer forming process of step S22, a drying process of step S23, a compacting process of step S24, a primary selenization/sulfidation reaction process of step S25, a thermal process S26, an impure phase removing process of step S27, a rear stage selenization/sulfidation reaction process of step S28, and a cadmium sulfide layer growing process of step S29. The copper/indium/gallium/selenium layer and the cadmium sulfide layer are formed on the first TCO layer by using a copper/indium/gallium/selenium layer and a cadmium sulfide layer forming apparatus.

The steps S21, S22, S23 and S24 are similar to the steps S11, S12, S13 and S14, and the difference are that the copper/ indium/gallium/selenium layer slurry is formed by using a mixing apparatus in the step S21, and the at least one powder used comprises at least one of copper indium alloy (CuIn) powder, copper indium gallium compound (CuInGa) powder, copper indium selenide (CuInSe) powder, copper indium gallium selenide (CuInGaSe) powder, copper indium sulfide (CuInS) powder, and copper indium gallium sulfide (CuInGaS) powder. In the coating layer forming process of the step S22, a copper/indium/gallium/selenium layer slurry coating layer is formed on the first TCO layer. The drying process of the step S23 performs pre-drying and removing the solvent in the copper/indium/gallium/selenium layer slurry coating layer by using a drying apparatus, and the compacting step of the step S24 performs compacting for the copper/indium/gallium/selenium layer slurry coating layer by using a compacting apparatus.

In the step S25, the primary selenization/sulfidation reaction process comprises a primary sulfidation reaction and a primary selenidation reaction such that the sulfides and the selenides are formed from the copper/indium/gallium/selenium slurry coating and thereby a primary copper/indium/gallium/selenium layer is formed by using a primary selenization/sulfidation reaction apparatus. In the step S26, the rapid thermal annealing treatment, which is similar to the step S15 in the FIG. 2, is performed to improve the crystal structure of the primary copper/indium/gallium/selenium layer by using a rapid thermal annealing apparatus. In the step S27, in the impure phase removing process, the impure compounds are removed from the primary copper/indium/gallium/selenium layer by using an impure phase removing apparatus, and then the cleaning and drying step is performed. In the step S28, the rear stage selenization/sulfidation reaction process is similar to the primary selenization/sulfidation reaction process and further performs a rear stage sulfidation reaction and a rear stage selenidation reaction for the primary copper/indium/gallium/selenium layer by using a rear stage selenization/sulfidation reaction apparatus to form a rear stage copper/indium/gallium/selenium layer which is the desired copper/indium/gallium/selenium layer.

In the step S29, in the cadmium sulfide layer growing process the cadmium sulfide layer, which is a cadmium sulfide buffer layer, is formed on the copper/indium/gallium/selenium layer (which is formed at the step S28) by using a cadmium sulfide layer growing apparatus with the chemical bath deposition (CBD) method. The step S29 further comprises a substrate scraping process and a cleaning and drying process to scrape the unwanted material on the substrate and to clean and dry the copper/indium/gallium/selenium layer, respectively.

Figure 5:
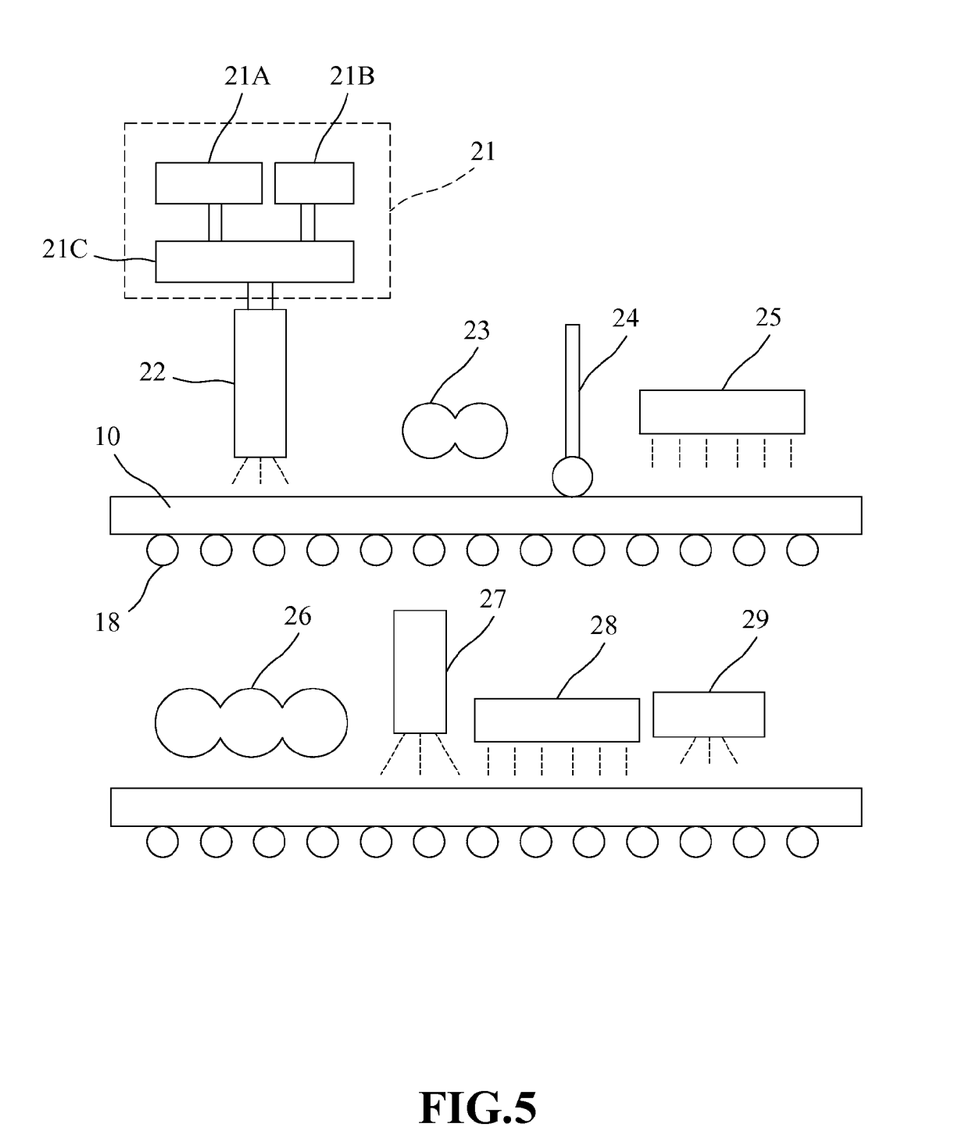
FIG. 5 is a schematic diagram illustrating the copper/indium/gallium/selenium layer and the cadmium sulfide layer forming apparatus according to the present invention.

Referring to FIG. 5, a schematic diagram illustrates the copper/indium/gallium/selenium layer and the cadmium sulfide layer forming apparatus according to the present invention. As shown in FIG. 5, the copper/indium/gallium/selenium layer and the cadmium sulfide layer forming apparatus comprises a mixing apparatus 21, a coating layer forming apparatus 22, a drying apparatus 23, a compacting apparatus 24, a primary selenization/sulfidation reaction apparatus 25, a thermal process apparatus 26, an impure phase removing apparatus 27, a rear stage selenization/sulfidation reaction apparatus 28, and a cadmium sulfide layer growing apparatus 29, wherein the mixing apparatus 21, the coating layer forming apparatus 22, the drying apparatus 23, the compacting apparatus 24, and the thermal process apparatus 26 are similar to the mixing apparatus 11, the coating layer forming apparatus 12, the drying apparatus 13, the compacting apparatus 14, and the thermal process apparatus 15 in FIG. 3. The mixing apparatus 21 comprises a powder trough 21A, a solvent trough 21B, and a mixing trough 21C, and the coating layer forming apparatus 22 comprises a plurality of supersonic nozzles, a supersonic controller, and an air pressure flow rate controller (not shown).

The hydrogen sulfide and hydrogen selenide are sequentially fed into the primary selenization/sulfidation reaction apparatus 25 to perform a primary sulfidation reaction and a primary selenidation reaction at rising temperatures. The impure phase removing apparatus 27 comprises an impure phase removing agent to remove the impure phase compounds which comprises at least one of copper sulfide and copper selenide, wherein the impure phase removing agent comprises at least one of sodium cyanide (NaCN), potassium cyanide (KCN) and bromides. The rear stage selenization/sulfidation reaction apparatus 28 is similar to the primary selenization/sulfidation reaction apparatus 25 and sequentially, in which the hydrogen sulfide and hydrogen selenide are sequentially fed to perform the rear stage sulfidation reaction and rear stage selenidation reaction at rising temperatures.

The cadmium sulfide layer growing apparatus 29 comprises a solution containing sulfur and cadmium for immersing the copper/indium/gallium/selenium layer in the solution, and the cadmium sulfide layer is formed on the copper/indium/gallium/selenium layer, and the solution comprises ammonia, thiourea, and chlorides including at least one of cadmium chloride, cadmium sulfate, cadmium iodide and cadmium diacetate.

Figure 6:
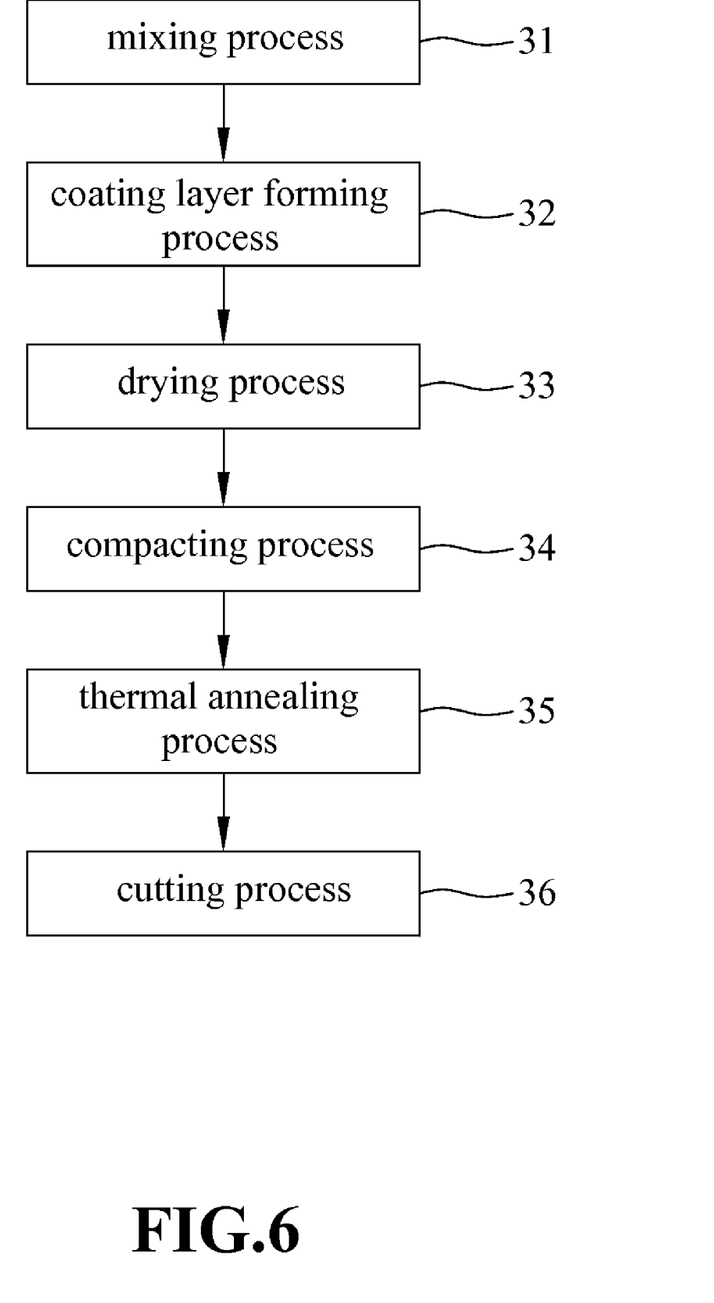
FIG. 6 is a block diagram illustrating the zinc oxide layer forming process according to the present invention.

Referring to FIG. 6, a block diagram illustrates the zinc oxide layer forming process according to the present invention. As shown in FIG. 6, in the zinc oxide layer forming process, which is similar to the step S10 in FIG. 2, a mixing process of step S31, a coating layer forming process of step S32, a drying process of step S33, a compacting process of step S34, a thermal process of step S35, and a cutting process of step S36 are sequentially performed by using a zinc oxide layer forming apparatus. The difference are that the at least one powder comprises zinc oxide powder. In the step S31, the zinc oxide powder and a solvent including at least one of alcohols, amines, dispersant, adhesive and levelling agents are mixed to form a zinc oxide slurry, then the zinc oxide slurry is applied to the cadmium sulfide layer in the step S32 to form a zinc oxide coating layer, and the zinc oxide coating layer is dried in the next step S33 and becomes compacted by performing the compacting process in the step S34, and in the step S35, a thermal process is performed to improve the crystal structure of the zinc oxide coating layer to form the zinc oxide layer, and finally a cutting process is performed to form the segmented work pieces.

Figure 7:
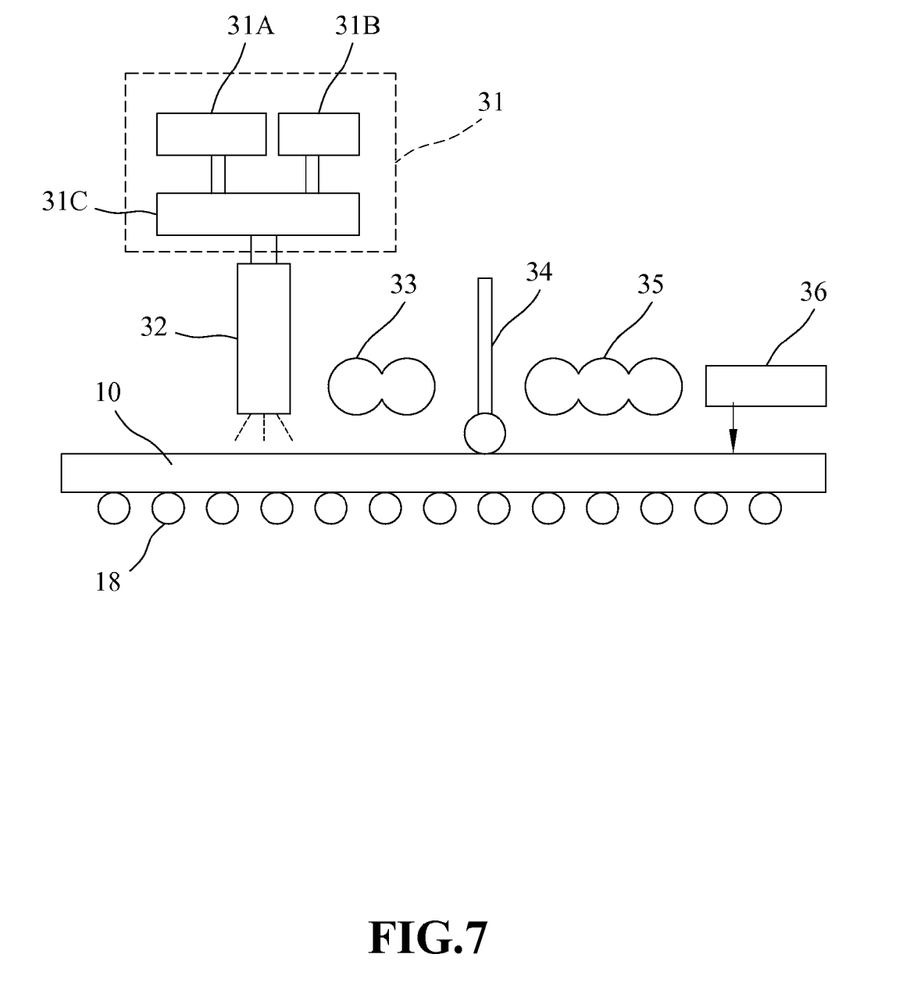
FIG. 7 is a schematic diagram illustrating the zinc oxide layer forming apparatus for according to the present invention.

Referring to FIG. 7, a schematic diagram illustrates the zinc oxide layer forming apparatus for according to the present invention. As shown in FIG. 7, the zinc oxide layer forming apparatus, which is similar to the first TCO layer forming apparatus in FIG. 3, comprises a mixing apparatus 31, a coating layer forming apparatus 32, a drying apparatus 33, a compacting apparatus 34, a thermal process apparatus 35, and a cutting apparatus 36, and by using the above-mentioned apparatuses the mixing process, the coating layer forming process, the drying process, the compacting process, the thermal process, and the cutting process in FIG. 6 are performed respectively to form the zinc oxide layer on the cadmium sulfide layer. The mixing apparatus 31 comprises a powder trough 31A, a solvent trough 31B, and a mixing trough 31C, and the coating layer forming apparatus 32 comprises a plurality of supersonic nozzles, a supersonic controller, and an air pressure flow rate controller (not shown), the difference is that the powder trough 31A contains the zinc oxide powder.

Furthermore, in the second TCO layer forming process in step S40, which is the same as the first TCO layer forming process in step S10, a mixing process, a coating layer forming process, a drying process, a compacting process, a thermal process, and a cutting process are sequentially performed to form a second TCO layer on the zinc oxide layer by using a second TCO layer forming apparatus. The second TCO layer forming apparatus is the same as the first TCO layer forming apparatus so that the superfluous description is omitted herein.

Therefore, the process of the present invention can form a solar cell having a first TCO layer, a copper/indium/gallium/selenium layer and a cadmium sulfide layer, a zinc oxide layer, and a second TCO layer laminated sequentially from bottom to top on the backside electrode layer.

The characteristics of the present invention are that the first TCO layer forming process, the copper/indium/gallium/selenium layer and a cadmium sulfide layer forming process, the zinc oxide forming process, and the second TCO forming process are integrated together. By wet process under non-vacuum condition, the first TCO layer, the copper/indium/gallium/selenium layer and a cadmium sulfide layer, the zinc oxide layer, and the second TCO layer are sequentially formed on the backside electrode layer to form a copper/indium/gallium/selenium (CIGS) solar cell with high conversion efficiency. The process of present invention is suitable for mass production. By using the process of present invention, the fabricating cost can be reduced, the fabricating procedure can be simplified, and the good yield of production can be increased.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for fabricating a copper/indium/gallium/selenium solar cell by a wet process under non-vacuum condition that forms the copper/indium/gallium/selenium solar cell having a first transparent conduction oxide (TCO) layer, a copper/indium/gallium/selenium layer and a cadmium sulfide layer, a zinc oxide layer, and a second TCO layer, the method comprising the following steps:

performing a first TCO layer forming process for a substrate having a backside electrode layer thereon by using a first TCO layer forming apparatus, wherein the backside electrode layer located on the substrate with a plurality of rollers thereunder, and the substrate is drove forward, and the first TCO layer forming process comprises a mixing process, a coating layer forming process, a drying process, a compacting process, a thermal process, and a cutting process, to form the first TCO layer on the backside electrode;

performing a copper/indium/gallium/selenium layer forming process and a cadmium sulfide layer forming process by using a copper/indium/gallium/selenium layer forming apparatus and a cadmium sulfide layer forming apparatus, wherein the copper/indium/gallium/selenium layer and the cadmium sulfide layer forming process comprises a mixing process, a coating layer forming process, a drying process, a compacting process, a primary selenization/sulfidation reaction process, a thermal process, an impure phase removing process, a rear stage selenization/sulfidation reaction process and a cadmium sulfide layer growing process, to sequentially form the copper/indium/gallium/selenium layer and the cadmium sulfide layer on the first TCO layer;

performing a zinc oxide layer forming process by using a zinc oxide layer forming apparatus, wherein the zinc oxide layer forming process comprises a mixing process, a coating layer forming process, a drying process, a compacting process, a thermal process, and a cutting process, to form the zinc oxide layer on the cadmium sulfide layer; and performing a second TCO forming process by using a second TCO layer forming apparatus, wherein the second TCO layer forming process forming process comprises a mixing process, a coating layer forming process, a drying process, a compacting process, a thermal process, and a cutting process, to form the second TCO layer on the zinc oxide layer.

2. The method according to claim 1, wherein the first TCO layer forming apparatus comprises a mixing apparatus, a coating layer forming apparatus, a drying apparatus, a compacting apparatus, a thermal process apparatus and a cutting apparatus, to perform the mixing process, the coating layer forming process, the drying process, the compacting process, the thermal process, and the cutting process, respectively.

3. The method according to claim 2, wherein the mixing apparatus comprises a powder trough containing at least one powder, a solvent trough containing at least one solvent, and a mixing trough which uniformly mixing the at least one powder and the at least one solvent.

4. The method according to claim 3, wherein the at least one powder contained in the powder trough of the first TCO layer forming apparatus comprises at least one of indium tin oxide, tin dioxide, indium titanium oxide, and aluminum zinc oxide, the at least one powder contained in the powder trough of the copper/indium/gallium/selenium layer and the cadmium sulfide layer forming apparatus comprises at least one of copper indium alloy powder, copper indium gallium compound powder, copper indium selenide powder, copper indium gallium selenide powder, copper indium sulfide powder, and copper indium gallium sulfide powder, the at least one powder contained in the powder trough of the zinc oxide layer forming apparatus comprises zinc oxide powder, the at least one powder contained in the powder trough of the second TCO layer forming apparatus comprises at least one of indium tin oxide, tin dioxide, indium titanium oxide, and aluminum zinc oxide, and the at least one solvent, which contained in the solvent trough of each of the first TCO layer forming apparatus, the copper/indium/gallium/selenium layer and the cadmium sulfide layer forming apparatus, the zinc oxide layer forming apparatus, and the second TCO layer forming apparatus, comprises at least one of alcohols, amines, dispersant, adhesive and levelling agents.

5. The method according to claim 2, wherein the coating layer forming apparatus comprises one of a spray coating apparatus for performing spray coating, a coating apparatus for performing coating, and an immersing apparatus for immersing, wherein the spray coating apparatus comprises a plurality of supersonic nozzles, a supersonic controller, and an air pressure flow rate controller.

6. The method according to claim 2, wherein the drying apparatus is a heating apparatus including at least one of an electrically heated wire, an ultra-red (IR) ray source, and a radiation source including a microwave source.

7. The method according to claim 2, wherein the compacting apparatus comprises a rolling apparatus for performing a rolling process, a high-pressure liquid laminate spray apparatus for performing a high-pressure liquid laminate spray process, and a high-pressure gas laminate spray apparatus for performing a high-pressure gas laminate spray process, wherein the rolling apparatus comprises a plurality of rollers for sequentially applying low pressure, middle pressure, and high pressure, to perform compacting step by step.

8. The method according to claim 2, wherein the thermal process apparatus sequentially performs a rapid thermal crystallization process, a multi-stage crystallization process at a constant temperature, and a multi-stage cooling process by using a heating apparatus and a cooling apparatus.

9. The method according to claim 2, wherein the cutting apparatus comprises a laser and a scraping knife to perform the cutting process.

10. The method according to claim 1, wherein the copper/indium/gallium/selenium layer and the cadmium sulfide layer forming apparatus comprises a mixing apparatus, a coating layer forming apparatus, a drying apparatus, a compacting apparatus, a primary selenization/sulfidation reaction apparatus, a thermal process apparatus, an impure phase removing apparatus, a rear stage selenization/sulfidation reaction apparatus, and a cadmium sulfide layer growing apparatus, to perform the mixing process, the coating layer forming process, the drying process, the compacting process, the primary selenization/sulfidation reaction process, the thermal process, the impure phase removing process, the rear stage selenization/sulfidation reaction process, and the cadmium sulfide layer growing process, respectively.

11. The method according to claim 10, wherein the primary selenization/sulfidation reaction apparatus is sequentially fed in hydrogen sulfide and hydrogen selenide, to perform a primary sulfidation reaction and a primary selenization reaction at rising temperatures.

12. The method according to claim 10, wherein the impure phase removing apparatus comprises an impure phase removing agent to remove the impure phase compounds including at least one of copper sulfide and copper selenide, and the impure phase removing agent comprises at least one of sodium cyanide, potassium cyanide and bromides.

13. The method according to claim 10, wherein the rear stage selenization/sulfidation reaction apparatus is sequentially fed in hydrogen sulfide and hydrogen selenide, to perform a rear stage sulfidation reaction and a rear stage selenization reaction at rising temperatures.

14. The method according to claim 1, wherein the zinc oxide layer forming apparatus comprises a mixing apparatus, a coating layer forming apparatus, a drying apparatus, a compacting apparatus, a thermal process apparatus, and a cutting apparatus, to perform the mixing process, the coating layer forming process, the drying process, the compacting process, the thermal process, and the cutting process, respectively.

15. The method according to claim 1, wherein the second TCO layer forming apparatus comprises a mixing apparatus, a coating layer forming apparatus, a drying apparatus, a compacting apparatus, a thermal process apparatus, and a cutting apparatus, to perform the mixing process by mixing a transparent conductive oxide powder with at least one solvent, the coating layer forming process, the drying process, the compacting process, the thermal process, and the cutting process, respectively.

16. The method according to claim 1, wherein the cadmium sulfide layer forming process comprises a solution containing sulfur and cadmium, in which the copper/indium/gallium/selenium layer is immersed to form the cadmium sulfide layer on the copper/indium/gallium/selenium layer, and the solution comprises ammonia, thiourea, and chlorides including at least one of cadmium chloride, cadmium sulfate, cadmium iodide and cadmium diacetate.

* * * * *